US012727206B2

(12) United States Patent
Yoo et al.

(10) Patent No.: US 12,727,206 B2
(45) Date of Patent: Sep. 1, 2026

(54) SEMICONDUCTOR DEVICE INCLUDING TWO-DIMENSIONAL MATERIAL AND ELECTRONIC APPARATUS INCLUDING THE SEMICONDUCTOR DEVICE

(71) Applicant: Samsung Electronics Co., Ltd., Suwon-si (KR)

(72) Inventors: Joungeun Yoo, Suwon-si (KR); Changhyun Kim, Suwon-si (KR); Kyung-Eun Byun, Suwon-si (KR); Minsu Seol, Suwon-si (KR); Keunwook Shin, Suwon-si (KR); Eunkyu Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 416 days.

(21) Appl. No.: 18/321,290

(22) Filed: May 22, 2023

(65) Prior Publication Data

US 2024/0047564 A1 Feb. 8, 2024

(30) Foreign Application Priority Data

Aug. 8, 2022 (KR) ........................ 10-2022-0098836

(51) Int. Cl.
*H10D 48/36* (2025.01)
*H10D 62/80* (2025.01)

(52) U.S. Cl.
CPC ........... *H10D 48/362* (2025.01); *H10D 62/80* (2025.01)

(58) Field of Classification Search
CPC ............................. H10D 48/362; H10D 62/80
See application file for complete search history.

(56) References Cited

U.S. PATENT DOCUMENTS

| | | | |
|---|---|---|---|
| 11,362,180 B2 * | 6/2022 | Wang ..................... | H10D 62/80 |
| 2005/0093098 A1 | 5/2005 | Hirose et al. | |
| 2005/0095763 A1 | 5/2005 | Samavedam et al. | |
| 2009/0218576 A1 | 9/2009 | Dairiki et al. | |
| 2012/0068161 A1 | 3/2012 | Lee et al. | |
| 2017/0117367 A1 | 4/2017 | Engel et al. | |
| 2017/0345944 A1 * | 11/2017 | Lin .................... | H10D 30/6734 |
| 2018/0040737 A1 | 2/2018 | Nam et al. | |

(Continued)

FOREIGN PATENT DOCUMENTS

| | | | |
|---|---|---|---|
| CN | 115064597 A * | 9/2022 | ........... G02F 1/1368 |
| JP | 2005/159310 A | 6/2005 | |

(Continued)

OTHER PUBLICATIONS

Deji Akinwande et al., "Graphene and two-dimensional materials for silicon technology," Nature, 2019.

(Continued)

*Primary Examiner* — Sardis F Azongha
(74) *Attorney, Agent, or Firm* — HARNESS, DICKEY & PIERCE, P.L.C.

(57) ABSTRACT

A semiconductor device may include a channel layer including a two-dimensional (2D) semiconductor material, a gate insulating layer on a center portion of the channel layer, a gate electrode on the gate insulating layer, and a first conductive layer and a second conductive layer respectively contacting opposite sides of the channel layer. Each of the first and second conductive layers may include metal boride.

20 Claims, 9 Drawing Sheets

(56) References Cited

U.S. PATENT DOCUMENTS

| | | | |
|---|---|---|---|
| 2021/0305378 | A1 | 9/2021 | Seol et al. |
| 2021/0359099 | A1 | 11/2021 | Shen et al. |
| 2022/0238721 | A1 | 7/2022 | Nguyen et al. |

FOREIGN PATENT DOCUMENTS

| | | | |
|---|---|---|---|
| JP | 2008-218960 | A | 9/2008 |
| KR | 10-2012-0084840 | A | 7/2012 |
| KR | 10-2017-0015645 | A | 2/2017 |
| KR | 10-2018-0074857 | A | 7/2018 |
| KR | 10-2020-0132030 | A | 11/2020 |
| KR | 10-2021-0121948 | A | 10/2021 |
| KR | 10-2022-0107576 | A | 8/2022 |

OTHER PUBLICATIONS

Xianhu Liu et al., "Ultrathin fexible poly(vinylidene fuoride)/MXene/silver nanowire flm with outstanding specifc EMI shielding and high heat dissipation," Advanced Composites and Hybrid Materials, 2021.

Dooho Choi, "Potential of Ruthenium and Cobalt as Next-generation Semiconductor Interconnects," Korean J. Met. Mater. 56, pp. 605-610, 2018.

Extended European Search Report dated Dec. 18, 2023 for corresponding European Patent Application No. 23185769.9.

Shen Pin-Chun et al, "Ultralow contact resistance between semimetal and monolayer semiconductors", Nature,, vol. 593, No. 7858, (May 12, 2021), pp. 211-217, XP 037450461.

Magnuson Martin et al, "Review of transition-metal diboride thin films", Vacuum, Pergamon Press, GB, vol. 196, (Sep. 3, 2021), XP086906507.

The Abstract of F. P. Doty et al., "Structure and properties of lanthanide halides", Proc. SPIE 6707, Penetrating Radiation Systems and Applications VIII, 670705 (Oct. 2, 2007); https://doi.org/10.1117/12.740849.

Materials Data on UCI3 by Materials Project, United States: N. p., 2020. Web. doi:10.17188/1199326.

Korean Office Action dated Jan. 30, 2026 for corresponding Korean Patent Application No. 10-2022-0098836 and its English-language translation.

* cited by examiner

SEMICONDUCTOR DEVICE INCLUDING TWO-DIMENSIONAL MATERIAL AND ELECTRONIC APPARATUS INCLUDING THE SEMICONDUCTOR DEVICE

CROSS-REFERENCE TO RELATED APPLICATION

This application is based on and claims priority under 35 U.S.C. § 119 to Korean Patent Application No. 10-2022-0098836, filed on Aug. 8, 2022, in the Korean Intellectual Property Office, the disclosure of which is incorporated by reference herein in its entirety.

BACKGROUND

1. Field

The present disclosure relates to a semiconductor device including a two-dimensional (2D) material and an electronic apparatus including the semiconductor device.

2. Description of the Related Art

A transistor is a semiconductor device for performing electrical switching, and may be widely used in various semiconductor products such as a memory, a driving integrated circuit (IC), etc. When the size of a semiconductor device is reduced, the number of semiconductor devices that may be integrated in one wafer may increase and a driving speed of the semiconductor device also may increase. Thus, research on reducing the size of semiconductor devices has been actively conducted.

Recently, research on using two-dimensional (2D) materials has been conducted to reduce the size of semiconductor devices. A 2D material may be stable and may have excellent characteristics even with a thickness of 1 nm or less, and thus, has been highlighted as a material for overcoming limitations of performance degradation caused due to the reduction in the size of semiconductor devices.

SUMMARY

According to an embodiment, a semiconductor device including a two-dimensional (2D) material and an electronic apparatus including the semiconductor device are provided.

Additional aspects will be set forth in part in the description which follows and, in part, will be apparent from the description, or may be learned by practice of the presented embodiments of the disclosure.

According to an embodiment, a semiconductor device may include a channel layer including a two-dimensional (2D) semiconductor material, a gate insulating layer on a center portion of the channel layer, a gate electrode on the gate insulating layer, and a first conductive layer and a second conductive layer respectively contacting opposite sides of the channel layer. Each of the first conductive layer and the second conductive layer may include metal boride.

In some embodiments, the metal boride may include a compound of a transition metal and boron (B). The metal boride may include at least one of $YB_4$, $LaB_6$, $MnB_2$, $NbB_2$, $TaB_2$, $ScB_2$, $CrB_2$, $TiB_2$, $ZrB_2$, and $HfB_2$.

In some embodiments, the metal boride may include a material having a semimetal characteristic. The metal boride may include at least one of $TiB_2$, $ZrB_2$, and $HfB_2$.

In some embodiments, the metal boride may include a material having a two-dimensional crystallization structure.

The metal boride may include a diboride including at least one of Sc, Y, Ti, Zr, Hf, V, Nb, Ta, Cr, Mo, W, Mn, Tc, Re, Ru, and Os.

In some embodiments, the first conductive layer and the second conductive layer may respectively include a source electrode and a drain electrode.

In some embodiments, the first conductive layer and the second conductive layer respectively may further include a source electrode and a drain electrode. The source electrode and the drain electrode may include a metal material.

In some embodiments, the first conductive layer and the second conductive layer may be on side surfaces of opposite sides of the channel layer. The first conductive layer and the second conductive layer may form edge contacts with the channel layer.

In some embodiments, the first conductive layer and the second conductive layer may be on upper surfaces and side surfaces of opposite sides of the channel layer.

In some embodiments, intermediate regions may be on interfaces between the first conductive layer and the channel layer and between the second conductive layer and the channel layer. The intermediate regions may have the 2D semiconductor material and the metal boride mixed with each other.

In some embodiments, the 2D semiconductor material may have a material having a band-gap of about 0.1 eV to about 3.0 eV.

In some embodiments, the 2D semiconductor material may include transition metal dichalcogenide (TMD), black phosphorous, or graphene.

In some embodiments, the 2D semiconductor material may include the TMD. The TMD may include a metal element and a chalcogen element. The metal may include one of Mo, W, Nb, Sn, V, Ta, Ti, Zr, Hf, Tc, and Re. The chalcogen element may include one of S, Se, and Te.

In some embodiments, the TMD may include at least one of $MoS_2$, $WS_2$, $TaS_2$, $HfS_2$, $ReS_2$, $TiS_2$, $NbS_2$, $SnS_2$, $MoSe_2$, $WSe_2$, $TaSe_2$, $HfSe_2$, $ReSe_2$, $TiSe_2$, $NbSe_2$, $SnSe_2$, $MoTe_2$, $WTe_2$, $TaTe_2$, $HfTe_2$, $ReTe_2$, $TiTe_2$, $NbTe_2$, and $SnTe_2$.

In some embodiments, the 2D semiconductor material may further include a dopant.

In some embodiments, the 2D semiconductor material may include one to ten layers. The 2D semiconductor material may include one to five layers.

In some embodiments, the gate electrode may include metal, conductive nitride, or conductive oxide.

According to an embodiment, a semiconductor device may include a channel layer including a two-dimensional (2D) semiconductor material; a gate insulating layer on the channel layer; a gate electrode on the gate insulating layer; and a first conductive layer and a second conductive layer that respectively contact opposite ends of the channel layer. The gate electrode may be between the first conductive layer and the second conductive layer. The gate electrode, the first conductive layer, and the second conductive layer may be spaced apart from each other. Each of the first conductive layer and the second conductive layer may include metal boride.

In some embodiments, the metal boride may include a compound of a transition metal and boron (B).

In some embodiments, the metal boride may include at least one of $YB_4$, $LaB_6$, $MnB_2$, $NbB_2$, $TaB_2$, $ScB_2$, $CrB_2$, $TiB_2$, $ZrB_2$, and $HfB_2$.

In some embodiments, the metal boride may include a diboride including at least one of Sc, Y, Ti, Zr, Hf, V, Nb, Ta, Cr, Mo, W, Mn, Tc, Re, Ru, and Os.

In some embodiments, a number of layers of the 2D semiconductor material may be one to ten. The first conductive layer may be in contact with an upper surface of the channel layer, a first side surface of the channel layer, or both the upper surface of the channel layer and the first side surface of the channel layer. The second conductive layer may be in contact with the upper surface of the channel layer, a second side surface of the channel layer, or both the upper surface of the channel layer and the second side surface of the channel layer. The first side surface of the channel layer may be opposite the second side surface of the channel layer. The gate electrode may be on the upper surface of the channel layer. A lower surface of the channel layer may be opposite the upper surface of the channel layer.

According to another embodiment, an electronic apparatus may include any one of the semiconductor devices described above.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
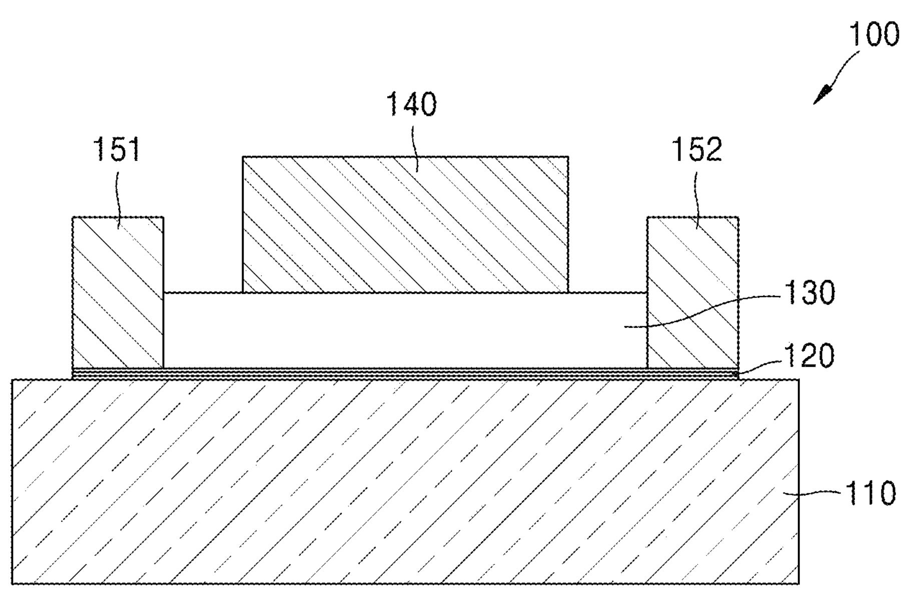
FIG. 1 is a cross-sectional view of a semiconductor device according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, "at least one of A, B, and C," and similar language (e.g., "at least one selected from the group consisting of A, B, and C") may be construed as A only, B only, C only, or any combination of two or more of A, B, and C, such as, for instance, ABC, AB, BC, and AC.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Hereinafter, one or more embodiments of the present disclosure will be described in detail with reference to accompanying drawings. In the drawings, like reference numerals denote like components, and sizes of components in the drawings may be exaggerated for convenience of explanation. The embodiments of the disclosure are capable of various modifications and may be embodied in many different forms.

When a layer, a film, a region, or a panel is referred to as being "on" another element, it may be directly on/under/at left/right sides of the other layer or substrate, or intervening layers may also be present. An expression used in the singular encompasses the expression of the plural, unless it has a clearly different meaning in the context. It will be further understood that when a portion is referred to as "comprises" another component, the portion may not exclude another component but may further comprise another component unless the context states otherwise.

The use of the terms of "the above-described" and similar indicative terms may correspond to both the singular forms and the plural forms. Also, the steps of all methods described herein may be performed in any suitable order unless otherwise indicated herein or otherwise clearly contradicted by context.

Also, the terms " . . . unit", " . . . module" used herein specify a unit for processing at least one function or operation, and this may be implemented with hardware or software or a combination of hardware and software.

Furthermore, the connecting lines or connectors shown in the drawings are intended to represent example functional relationships and/or physical or logical couplings between the various elements. It should be noted that many alternative or additional functional relationships, physical connections, or logical connections may be present in a practical device.

The use of any and all examples, or example language provided herein, is intended merely to better illuminate the present disclosure and does not pose a limitation on the scope of the present disclosure unless otherwise claimed.

FIG. 1 is a cross-sectional view of a semiconductor device 100 according to an embodiment. The semiconductor device 100 of FIG. 1 may include, for example, a field effect transistor (FET).

Referring to FIG. 1, a channel layer 120 is provided on a substrate 110. The substrate 110 may include insulating substrates of various materials. Also, the substrate 110 may further include, for example, an impurity area obtained through doping, an electronic apparatus such as a transistor, or a periphery circuit for selecting and controlling memory cells storing data.

The channel layer 120 includes a two-dimensional (2D) semiconductor material. The 2D semiconductor material denotes a semiconductor material having a layered-structure in which element atoms are two-dimensionally bonded. The 2D semiconductor material has excellent electrical properties, and thus, characteristics thereof are not largely changed and high mobility may be maintained even when a thickness is reduced to a nano-scale.

The 2D semiconductor material may have a material having a band-gap of about 0.1 eV to about 3.0 eV. However, one or more embodiments are not limited thereto. The 2D semiconductor material may include, for example, transition metal dichalcogenide (TMD), black phosphorous, or graphene. However, one or more embodiments are not limited to the above example.

TMD is a compound of a transition metal and a chalcogen element. Here, the transition metal may include, for example, at least one selected from Mo, W, Nb, Sn, V, Ta, Ti, Zr, Hf, Tc, and Re, and the chalcogen element may include, for example, at least one selected from S, Se, and Te. In detail, the chalcogen element may include at least one selected from the group consisting of $MoS_2$, $WS_2$, $TaS_2$, $HfS_2$, $ReS_2$, $TiS_2$, $NbS_2$, $SnS_2$, $MoSe_2$, $WSe_2$, $TaSe_2$, $HfSe_2$, $ReSe_2$, $TiSe_2$, $NbSe_2$, $SnSe_2$, $MoTe_2$, $WTe_2$, $TaTe_2$, $HfTe_2$, $ReTe_2$, $TiTe_2$, $NbTe_2$, and $SnTe_2$. However, one or more embodiments are not limited to the above example.

The black phosphorous denotes a 2D material having a structure in which phosphor elements are two-dimensionally bonded. The graphene denotes a 2D material having a structure in which carbon (C) elements are two-dimensionally bonded.

The 2D semiconductor material forming the channel layer 120 may have a monolayer or a multilayer structure, and each layer may have a thickness in an atomic level. For example, the 2D semiconductor material may include one to ten layers. In more detail, for example, the 2D semiconductor material may include one to five layers. However, one or more embodiments are not limited thereto.

The channel layer 120 may include a certain dopant in order to adjust a mobility of the 2D semiconductor material. In detail, the 2D semiconductor material may be doped with a p-type dopant or an n-type dopant. The p-type dopant or the n-type dopant may be doped using an ion implantation or chemical doping method.

A source of the p-type dopant may include, for example, ionic liquid such as $NO_2BF_4$, $NOBF_4$, $NO_2SbF_6$, etc., acidic compound such as HCl, $H_2PO_4$, $CH_3OOOH$, $H_2SO_4$, $HNO_3$, etc., an organic compound such as dichlorodicyanoquinone (DDQ), oxone, dimyristoylphosphatidylinositol (DMPI), trifluoromethanesulfoneimide, etc. Alternatively, the source of the p-type dopant may include $HPtCl_4$, $AuCl_3$, $HAuCl_4$, silver trifluoromethanesulfonate (AgOTf), $AgNO_3$, $H_2PdCl_6$, $Pd(OAc)_2$, $Cu(CN)_2$, etc.

A source of the n-type dopant may include, for example, a reduction product of a substituted or unsubstituted nicotinamide, a reduction product of a compound which is chemically bound to a substituted or unsubstituted nicotinamide, and a compound comprising at least two pyridinium moieties in which a nitrogen atom of at least one of the pyridinium moieties is reduced. For example, the source of the n-type dopant may include nicotinamide mononucleotide-H (NMNH), nicotinamide adenine dinucleotide-H (NADH), nicotinamide adenine dinucleotide phosphate-H (NADPH), or viologen.

Alternatively, the source of the n-type dopant may include a polymer such as polyethylenimine (PEI), etc. Alternatively, the n-type dopant may include an alkali metal such as K, Li, etc. In addition, the p-type dopant and the n-type dopant materials mentioned above are examples, and the other various materials may be used as the dopant.

A gate insulating layer 130 is provided on the center portion of the channel layer 120, and a gate electrode 140 is provided on the gate insulating layer 130. The gate insulating layer 130 may include, for example, silicon nitride, etc., but is not limited thereto. The gate electrode 140 may include metal, conductive nitride, or conductive oxide. Here, the metal may include, for example, at least one from Au, Ti, W, Mo, Pt, and Ni. The conductive nitride may include, for example, TiN, TaN, WN, etc., and the conductive oxide may include, for example, indium tin oxide (ITO), indium zinc oxide (IZO), etc. However, one or more embodiments are not limited to the above example.

First and second conductive layers 151 and 152 are provided respectively on opposite sides of the channel layer 120 including the 2D semiconductor material. Here, the first and second conductive layers 151 and 152 may include metal boride. The first conductive layer 151 may be a source electrode and the second conductive layer 152 may be a drain electrode.

The metal boride is a compound of transition metal and a boron (B) element. Here, the transition metal may include, for example, at least one from Y, La, Sc, Cr, Mo, W, Nb, Sn, V, Ta, Ti, Zr, Hf, Tc, and Re. In detail, the metal boride may include at least one selected from the group consisting of $YB_4$, $LaB_6$, $MnB_2$, $NbB_2$, $TaB_2$, $ScB_2$, $CrB_2$, $TiB_2$, $ZrB_2$, and $HfB_2$. However, one or more embodiments are not limited to the above example.

The metal boride may include a material having a semimetal characteristic. For example, the metal boride having the semimetal characteristic may include $TiB_2$, $ZrB_2$, $HfB_2$, etc. However, one or more embodiments are not limited to the above example. The metal boride having the semimetal characteristic may restrain Fermi-level pinning of the 2D semiconductor material included in the channel layer 120, and accordingly, a contact resistance between the channel layer 120 including the 2D semiconductor material and source/drain electrodes including the metal boride may be improved.

The metal boride may include a material having a two-dimensional crystallization structure from among the metal borides. For example, the metal boride having the two-dimensional crystallization structure may include diboride including at least one from Sc, Y, Ti, Zr, Hf, V, Nb, Ta, Cr, Mo, W, Mn, Tc, Re, Ru, and Os. The metal boride having the two-dimensional crystallization structure may improve the mobility of the channel layer 120 by forming a Van der Waals bond with the 2D semiconductor material in the channel layer 120 and reducing defects in the 2D semiconductor material.

The first and second conductive layers 151 and 152 may be provided to be in contact with upper surfaces on opposite sides of the channel layer (120) (source/drain contact areas). Therefore, planar contacts may be formed between the first and second conductive layers 151 and 152 and opposite side portions of the channel layer 120. Here, the 2D semiconductor material in the channel layer 120 and the metal boride of the first and second conductive layers 151 and 152 may form contacts in vertical heterojunction structures.

Because the first and second conductive layers 151 and 152 including the metal boride are provided to be in contact with the opposite sides of the channel layer 120 having the 2D semiconductor material, contact resistances between the source/drain contact areas of the channel layer 120 and the first and second conductive layers 151 and 152 may be decreased.

When the source/drain electrodes include a metal material, high contact resistances between the metal materials in the source/drain electrodes and the 2D semiconductor material may generate issues. This may be caused by Fermi-level pinning that occurs due to a defect-inducted gap state (DIGS) caused by a metal-induced gap state (MIGS) that is generated through interaction between the metal material and the 2D semiconductor material and defects generated on the 2D semiconductor material when the metal material is deposited on the 2D semiconductor material.

In the embodiment, the first and second conductive layers 151 and 152 including the metal boride are provided on the source/drain contact areas of the channel layer 120, and thus, generation of the MIGS and the DIGS may be reduced. Accordingly, the contact resistances between the source/drain contact areas of the channel layer 120 and the first and second conductive layers 151 and 152 may be reduced.

Figure 2:
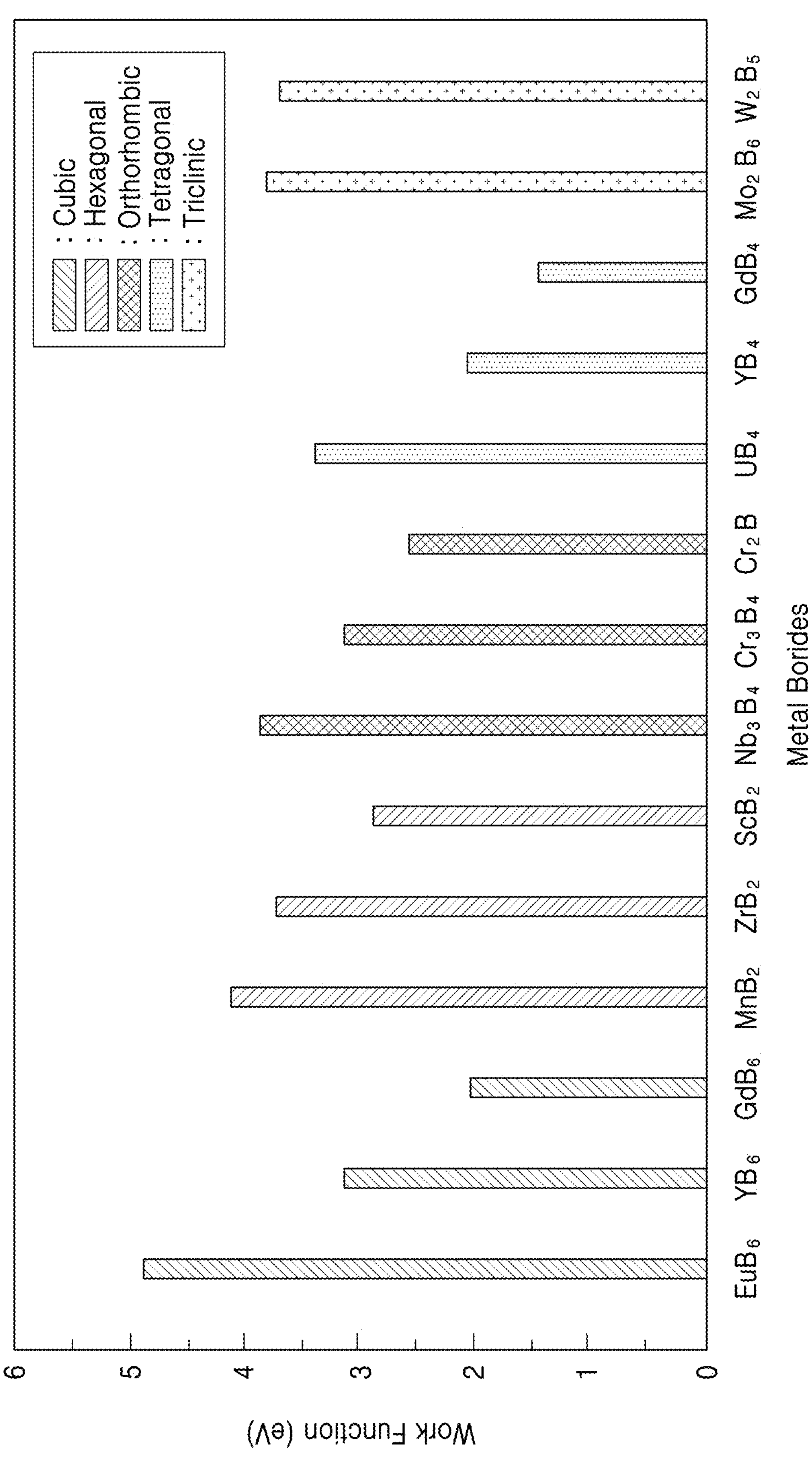
FIG. 2 is a diagram showing examples of various work functions and crystallization structures of metal boride.

FIG. 2 shows examples of work functions and crystallization structures of the metal borides. The metal boride may have various work functions according to a composition thereof. In addition, the work function of the metal boride may be adjusted even with the same composition. In detail, the metal boride may have the work function that varies depending on kinds of termination atoms within the same composition. For example, B-terminated TiB may have a work function of about 6.1 eV, and Ti-terminated TiB may have a work function of about 4.7 eV.

Because the metal borides may have the work functions in various ranges, the metal boride having appropriate work function may be selected according to the 2D semiconductor material used in the channel layer, and thus, the contact resistances between the source/drain contact areas of the channel layer 120 and the first and second conductive layers 151 and 152 may be reduced. For example, when a certain n-type 2D semiconductor material is used as the channel material, the first and second conductive layers 151 and 152 may include the metal boride having a work function that is less than the work function of the n-type 2D semiconductor material. For example, when a certain p-type 2D semiconductor material is used as the channel material, the first and second conductive layers 151 and 152 may include the metal boride having a work function that is greater than the work function of the p-type 2D semiconductor material.

The metal boride may have various crystallization structures according to the composition thereof. Therefore, when metal boride having a crystallization structure similar to that of the 2D semiconductor material used as the channel material is selected, occurrence of defects in the 2D semiconductor material during the deposition of the metal boride may be reduced, and accordingly, the contact resistance between the source/drain contact areas of the channel layer 120 and the first and second conductive layers 151 and 152 may be decreased. Also, because there is a Van der Waals interaction between the metal boride and the 2D semiconductor material used as the channel material, including most of 2D materials, occurrence of defects during the deposition of the metal boride may be reduced. Accordingly, the contact resistance between the source/drain contact areas of the channel layer 120 and the first and second conductive layers 151 and 152 may be decreased.

Figure 3:
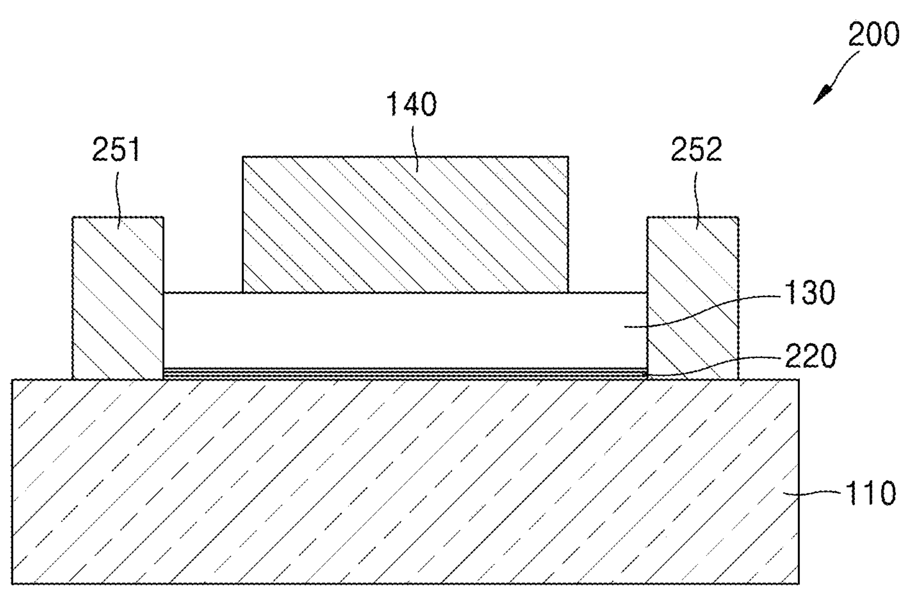
FIG. 3 is a cross-sectional view of a semiconductor device according to another embodiment.

FIG. 3 is a cross-sectional view of a semiconductor device 200 according to another embodiment. Hereinafter, differences from the above-described embodiments will be described.

Referring to FIG. 3, a channel layer 220 including a 2D semiconductor material is provided on the substrate 110. The 2D semiconductor material may include, for example, TMD, black phosphorous, or graphene. However, one or more embodiments are not limited to the above example.

The 2D semiconductor material in the channel layer 220 may have a single-layered or multi-layered structure. For example, the 2D semiconductor material may have one to ten layers (for example, one to five layers). However, one or more embodiments are not limited thereto. The channel layer 220 may further include a dopant such as a p-type dopant or an n-type dopant. The gate insulating layer 130 is provided on the center portion of the channel layer 220, and the gate electrode 140 is disposed on the gate insulating layer 130.

First and second conductive layers 251 and 252 are provided respectively on opposite sides of the channel layer 220 including the 2D semiconductor material. Here, the first and second conductive layers 251 and 252 may include metal boride. The first and second conductive layers 251 and 252 may be respectively a source electrode and a drain electrode.

The first and second conductive layers 251 and 252 may be provided to be in contact with side surfaces on opposite sides of the channel layer 220 (source/drain contact areas). Therefore, edge contacts may be formed between the first and second conductive layers 251 and 252 and opposite side portions of the channel layer 220. Here, the 2D semiconductor material in the channel layer 220 and the metal boride of the first and second conductive layers 251 and 252 may form contacts in lateral heterojunction structures.

Because the first and second conductive layers 251 and 252 including the metal boride are provided to be in contact with the opposite sides of the channel layer 220 having the 2D semiconductor material, contact resistances between the source/drain contact areas of the channel layer 220 and the first and second conductive layers 251 and 252 may be reduced.

Because the metal boride may have the work functions in various ranges according to a composition thereof, the metal boride having an appropriate work function may be selected according to the 2D semiconductor material used in the channel layer, and thus, the contact resistances between the source/drain contact areas of the channel layer 220 and the first and second conductive layers 251 and 252 may be reduced. Also, because the metal boride has various crystallization structures according to the composition thereof, when the metal boride having the crystallization structure that is similar to the 2D semiconductor material used as the channel material is selected, occurrence of defects in the 2D semiconductor material during the deposition of the metal boride may be reduced. Accordingly, the contact resistance between the source/drain contact areas of the channel layer 220 and the first and second conductive layers 251 and 252 may be decreased.

Figure 4:
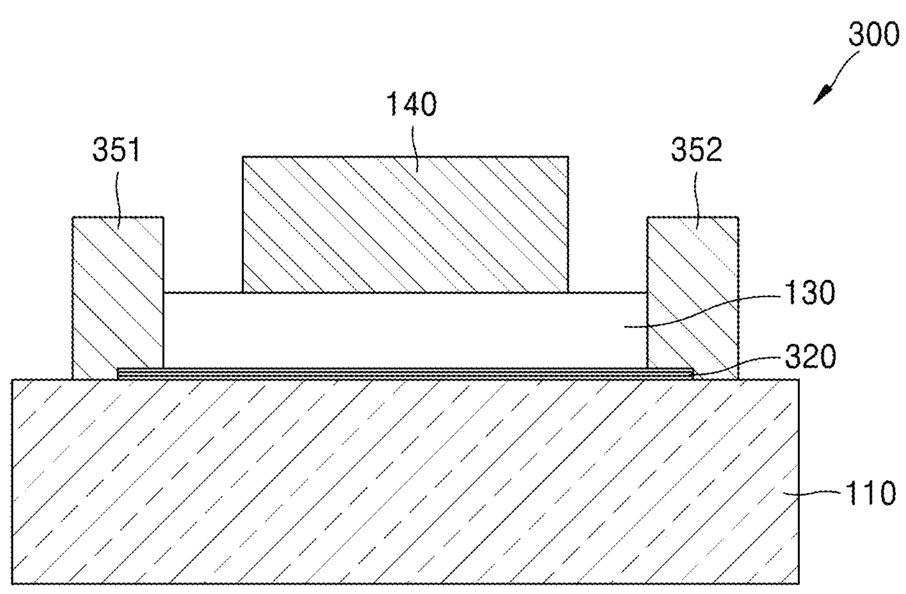
FIG. 4 is a cross-sectional view of a semiconductor device according to another embodiment.

FIG. 4 is a cross-sectional view of a semiconductor device 300 according to another embodiment. Hereinafter, differences from the above-described embodiments will be described.

Referring to FIG. 4, a channel layer 320 including a 2D semiconductor material is provided on the substrate 110. The 2D semiconductor material may include, for example, TMD, black phosphorous, or graphene. However, one or more embodiments are not limited to the above example.

The 2D semiconductor material in the channel layer 320 may have a monolayer or multilayer structure. For example, the 2D semiconductor material may have one to ten layers (for example, one to five layers). The channel layer 320 may further include a certain dopant. The gate insulating layer 130 is provided on the center portion of the channel layer 320, and the gate electrode 140 is disposed on the gate insulating layer 130.

First and second conductive layers 351 and 352 are provided respectively on opposite sides of the channel layer 320 including the 2D semiconductor material. Here, the first and second conductive layers 351 and 352 may include metal boride. The first and second conductive layers 351 and 352 may be respectively a source electrode and a drain electrode.

The first and second conductive layers 351 and 352 may be provided to be in contact with upper and side surfaces of opposite sides of the channel layer 320. Therefore, planar and edge contacts may be formed between the first and second conductive layers 351 and 352 and opposite side portions of the channel layer 320. In detail, the planar contacts are obtained between the first and second conductive layers 351 and 352 and the upper surfaces of the opposite sides of the channel layer 320, and the edge contacts may be obtained between the first and second conductive layers 351 and 352 and the side surfaces at the opposite sides of the channel layer 320. Here, the 2D semiconductor material in the channel layer 320 and the metal boride of the first and second conductive layers 351 and 352 may form contacts in vertical and lateral hetero-junction structures.

Because the first and second conductive layers 351 and 352 including the metal boride are provided to be in contact with the opposite sides of the channel layer 320 having the 2D semiconductor material, contact resistances between the source/drain contact areas of the channel layer 320 and the first and second conductive layers 351 and 352 may be reduced.

Figure 5:
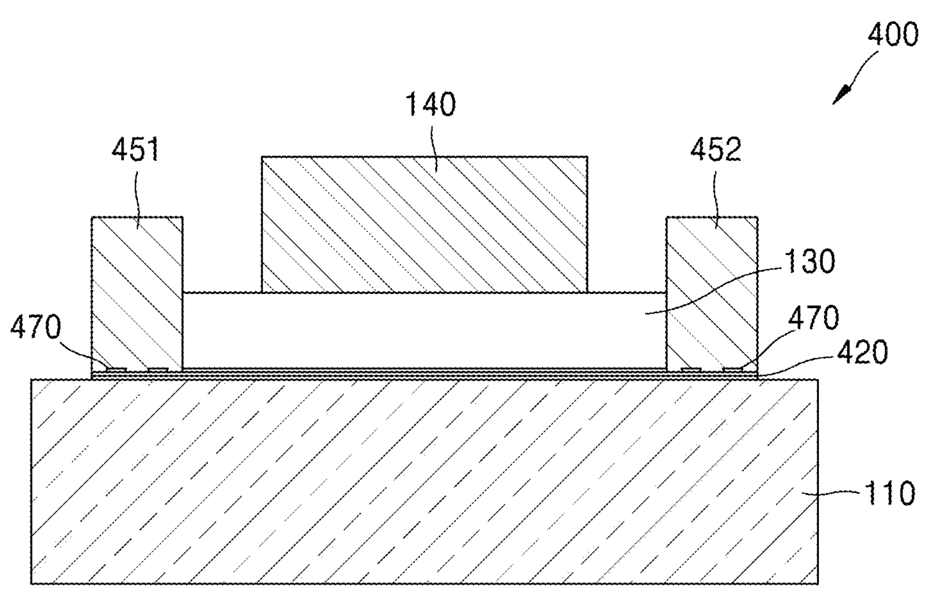
FIG. 5 is a cross-sectional view of a semiconductor device according to another embodiment.

FIG. 5 is a cross-sectional view of a semiconductor device 400 according to another embodiment. Hereinafter, differences from the above-described embodiments will be described.

Referring to FIG. 5, a channel layer 420 including a 2D semiconductor material is provided on the substrate 110. The 2D semiconductor material may include, for example, TMD, black phosphorous, or graphene. However, one or more embodiments are not limited to the above example. The 2D semiconductor material in the channel layer 420 may have a monolayer or multilayer structure. For example, the 2D semiconductor material may have one to ten layers (for example, one to five layers). However, one or more embodiments are not limited thereto. The channel layer 420 may further include a certain dopant. The gate insulating layer 130 is provided on the center portion of the channel layer 420, and the gate electrode 140 is provided on the gate insulating layer 130.

First and second conductive layers 451 and 452 are provided respectively on opposite sides of the channel layer 420 including the 2D semiconductor material. Here, the first and second conductive layers 451 and 452 may include metal boride. The first and second conductive layers 451 and 452 may be respectively a source electrode and a drain electrode.

The first and second conductive layers 451 and 452 may be provided to be in contact with opposite sides of the channel layer 420. Here, intermediate regions 470 may be formed on interfaces between the first and second conductive layers 451 and 452 and opposite sides of the channel layer 420. The intermediate regions 470 may be mixed regions of the 2D semiconductor material and the metal boride, which are formed in the process of depositing the metal boride included in the first and second conductive layers 451 and 452 on the 2D semiconductor material forming the channel layer 420.

Figure 6:
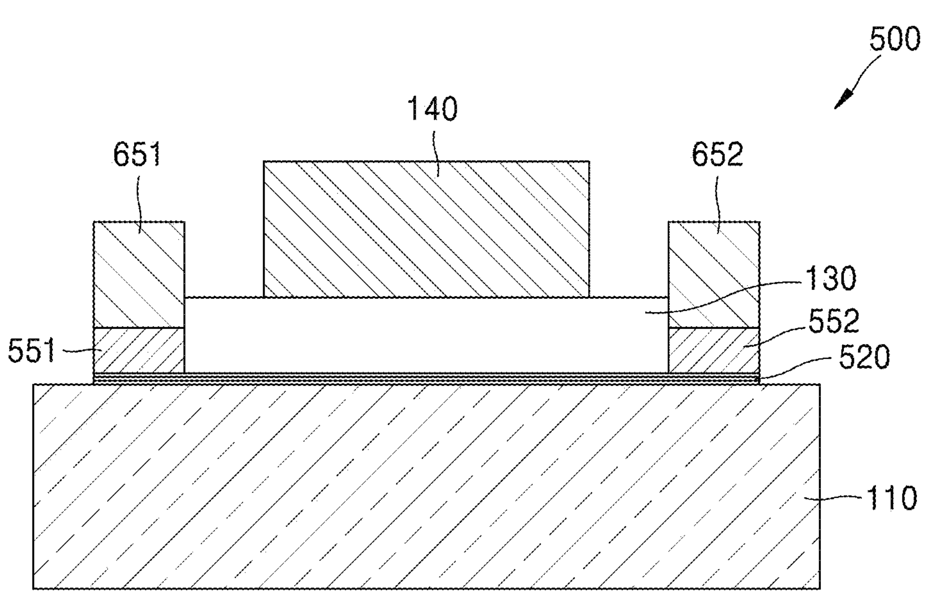
FIG. 6 is a cross-sectional view of a semiconductor device according to another embodiment.

FIG. 6 is a cross-sectional view of a semiconductor device 500 according to another embodiment. Hereinafter, differences from the above-described embodiments will be described.

Referring to FIG. 6, a channel layer 520 is provided on a substrate 110. The substrate 110 may include insulating substrates including various materials. Also, the substrate 110 may further include, for example, an impurity area obtained through doping, an electronic apparatus such as a transistor, or a periphery circuit for selecting and controlling memory cells storing data.

The channel layer 520 includes a 2D semiconductor material. The 2D semiconductor material may have, but is not limited to, a material having a band-gap of about 0.1 eV to about 3.0 eV. The 2D semiconductor material may include, for example, TMD, black phosphorous, or graphene. However, one or more embodiments are not limited to the above example. TMD may include transition metal including, for example, at least one from Mo, W, Nb, Sn, V, Ta, Ti, Zr, Hf, Tc, and Re and a chalcogen element including, for example, at least one from S, Se, and Te.

The 2D semiconductor material in the channel layer 520 may have a monolayer or multilayer structure. For example, the 2D semiconductor material may have, but is not limited to, one to ten layers (for example, one to five layers). The channel layer 520 may further include a certain dopant such as a p-type dopant or an n-type dopant.

The gate insulating layer 130 is provided on the center portion of the channel layer 520, and the gate electrode 140 is disposed on the gate insulating layer 130. The gate insulating layer 130 may include, for example, silicon nitride, etc., but is not limited thereto. The gate electrode 140 may include metal, conductive nitride, or conductive oxide.

First and second conductive layers 551 and 552 are provided respectively on opposite sides of the channel layer 520 including the 2D semiconductor material. Here, the first and second conductive layers 551 and 552 may include metal boride. A source contact 651 and a drain contact 652 respectively may be connected to the first and second conductive layers 551 and 552. The source and drain contacts 651 and 652 may include a conductive material, such as a metal or a metal alloy.

The metal boride is a compound of transition metal and a boron (B) element. Here, the transition metal lay include, for example, at least one from Y, La, Sc, Cr, Mo, W, Nb, Sn, V, Ta, Ti, Zr, Hf, Tc, and Re. In detail, the metal boride may include at least one selected from the group consisting of $YB_4$, $LaB_6$, $MnB_2$, $NbB_2$, $TaB_2$, $ScB_2$, $CrB_2$, $TiB_2$, $ZrB_2$, and $HfB_2$. However, one or more embodiments are not limited to the above example.

The metal boride may include a material having a semimetal characteristic. For example, the metal boride having the semimetal characteristic may include $TiB_2$, $ZrB_2$, $HfB_2$, etc. The metal boride may include a material having two-dimensional crystallization structure from among the metal borides. For example, the metal boride having the two-dimensional crystallization structure may include diboride including Sc, Y, Ti, Zr, Hf, V, Nb, Ta, Cr, Mo, W, Mn, Tc, Re, Ru, and Os.

The first and second conductive layers 551 and 552 may be provided to be in contact with opposite sides of the channel layer 520. FIG. 6 shows an example in which the first and second conductive layers 551 and 552 come into contact with the upper surfaces of the opposite sides of the channel layer 520 and form planar contacts. However, one or more embodiments are not limited thereto, and the first and second conductive layers 551 and 552 may form edge contacts by coming into contact with side surfaces of the opposite sides of the channel layer 520 and may form the planar and edge contacts by coming into contact with the upper and side surfaces of the opposite sides of the channel layer 520. Also, intermediate regions (not shown) in which the 2D semiconductor material and the metal boride are mixed may be formed at the interfaces between the first and second conductive layers 551 and 552 and the opposite side portions of the channel layer 520.

The first and second conductive layers 551 and 552 each have source and drain electrodes. The source and drain electrodes may include a metal material having excellent electric conductivity, for example, Ag, Au, Pt, or Cu, but are not limited thereto.

Because the first and second conductive layers 551 and 552 including the metal boride are provided to be in contact with the opposite sides of the channel layer 520 having the 2D semiconductor material, contact resistance between the source/drain contact areas of the channel layer 520 and the first and second conductive layers 551 and 552 may be reduced.

While the semiconductor devices 100, 200, 300, 400, and 500 are top-gate structures, example embodiments are not limited thereto. In some embodiments, a semiconductor device may have a dual-gate structure or a bottom-gate structure.

Figure 7:
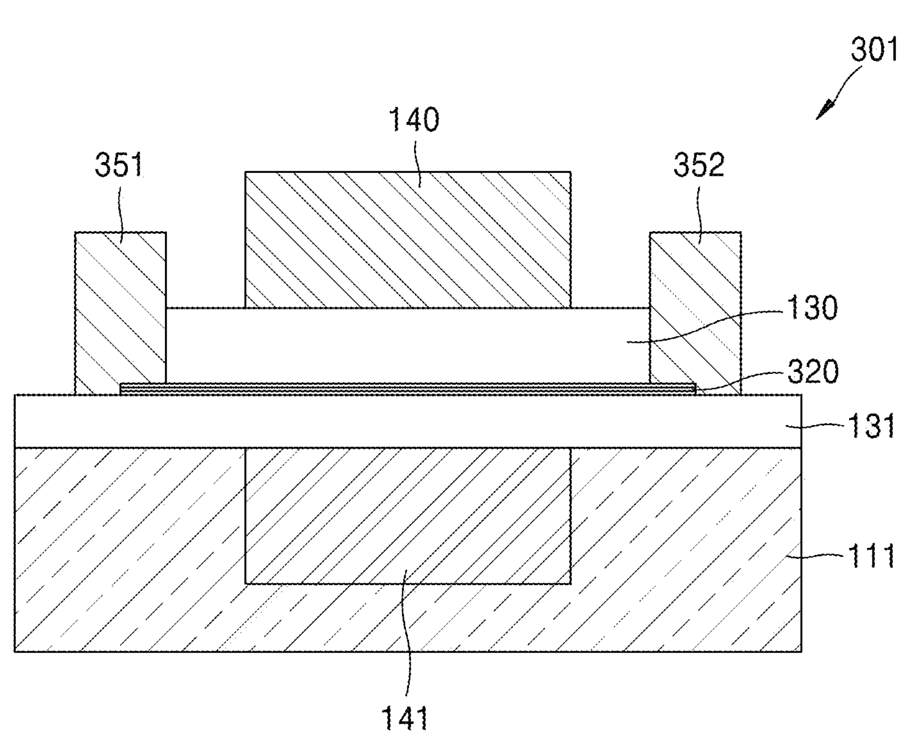
FIG. 7 is a cross-sectional view of a semiconductor device according to another embodiment.

For example, FIG. 7 is a cross-sectional view of a semiconductor device 301 according to another embodiment. Hereinafter, differences from the above-described embodiments will be described.

The semiconductor device 301 in FIG. 7 may be the same as the semiconductor device 300 in FIG. 4, except the semiconductor device 301 may further include a bottom gate electrode 141 in the substrate 111 and a gate insulating layer 131 between the bottom gate electrode 141 and the channel layer 320. The gate insulating layer 131 may cover an upper surface of the substrate 111 and an upper surface of the bottom gate electrode 141. The gate insulating layer 131 may contact lower surfaces of the first and second conductive layers 351 and 352 and a lower surface of the channel layer 320. The gate insulating layer 131 may include silicon nitride or another suitable insulating material, such as silicon oxide and the like. The bottom gate electrode 141 may include metal, conductive nitride, or conductive oxide. Here, the metal may include, for example, at least one from Au, Ti, W, Mo, Pt, and Ni. The conductive nitride may include, for example, TiN, TaN, WN, etc., and the conductive oxide may include, for example, indium tin oxide (ITO), indium zinc oxide (IZO), etc. However, one or more embodiments are not limited to the above example. The substrate 111 may include the same material as the substrate 110.

Although FIG. 7 illustrates a semiconductor device 301 including a bottom gate electrode 141 and a top gate electrode 140, one or more example embodiments are not limited thereto. In some embodiments, the gate insulating layer 130 and gate electrode 140 in the semiconductor device 301 may be omitted to provide a bottom-gate semiconductor device.

While FIG. 7 illustrates the channel layer 320 contacting a side surface and a lower surface of the first and second conductive layers 351 and 352, example embodiments are not limited thereto. Although not illustrated, the channel layer 320 alternatively may contact just the lower surfaces of the first and second conductive layers 351 and 352 or just the side surfaces of the of the first and second conductive layers 351 and 352 to provide planar contacts or edge contacts therebetween. Although not illustrated, intermediate regions (see 470 in FIG. 5) may be formed between the channel layer 320 and the first and second conductive layers 351 and 352.

The above-described semiconductor devices 100, 200, 300, 301, 400, and 500 may be applied to a memory device, for example, a DRAM device. The memory device may have a structure in which the semiconductor device 100, 200, 300, 301, 400, or 500 and a capacitor are electrically connected to each other. Also, the semiconductor device 100, 200, 300, 301, 400, and 500 may be applied to various electronic apparatuses. For example, the semiconductor devices 100, 200, 300, 301, 400, and 500 may be used for arithmetic calculations, program execution, temporary data retention, etc. in an electronic apparatus such as a mobile device, a computer, a laptop computer, a sensor, a network device, a neuromorphic device, etc.

Figure 8:
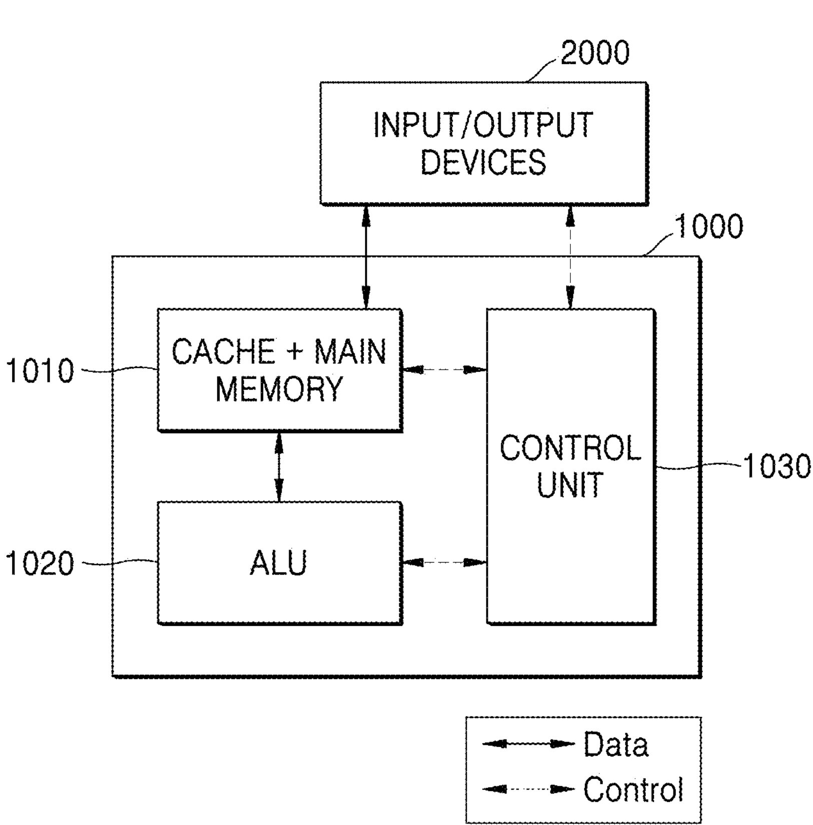
FIGS. 8 and 9 are conceptual diagrams schematically showing device architectures applied to an electronic apparatus, according to an embodiment.
Figure 9:
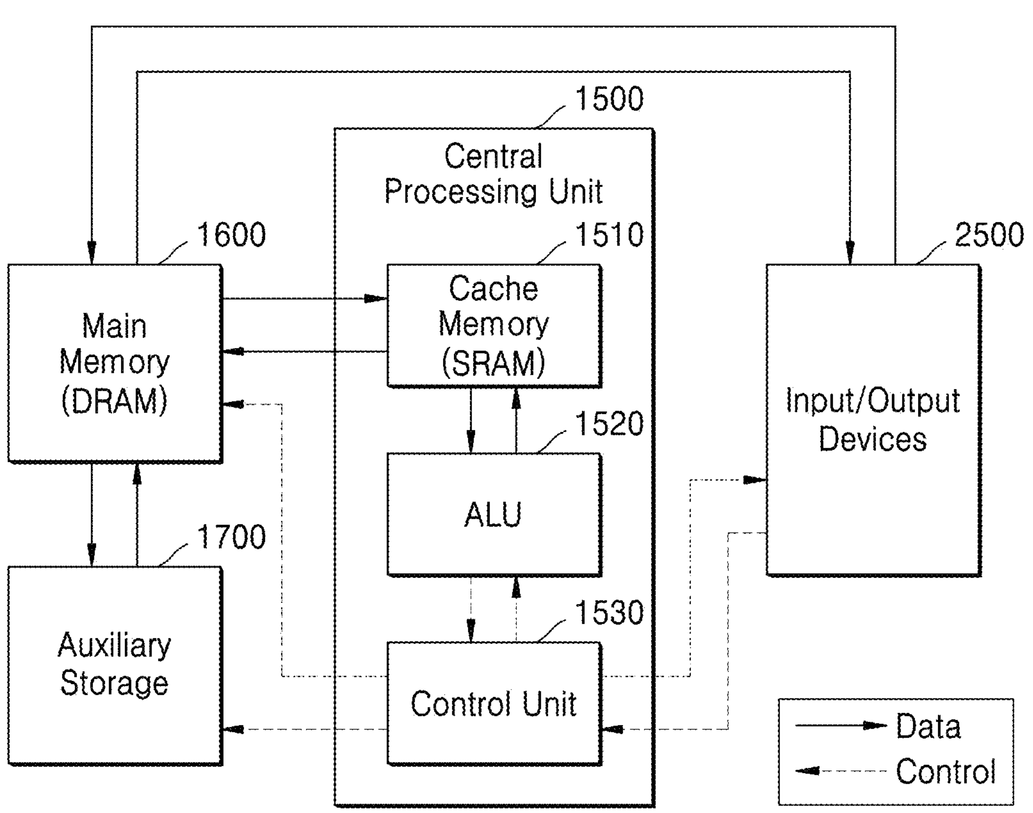

FIGS. 8 and 9 are conceptual diagrams schematically showing electronic device architectures applied to an electronic apparatus according to an embodiment.

Referring to FIG. 8, an electronic device architecture 1000 may include a memory unit 1010, an arithmetic logic unit (ALU) 1020, and a control unit 1030. The memory unit 1010, the ALU 1020, and the control unit 1030 may be electrically connected to one another. For example, the electronic device architecture 1000 may be implemented as one chip including the memory unit 1010, the AU 1020, and the control unit 1030.

In detail, the memory unit 1010, the ALU 1020, and the control unit 1030 may be connected to one another via metal lines on chip and directly communicate with one another. The memory unit 1010, the AU 1020, and the control unit 1030 may be monolithically integrated on one substrate and form one chip. An input/output device 2000 may be connected to the electronic device architecture (chip) 1000.

The ALU 1020 and the control unit 1030 may independently include the semiconductor devices 100-500 described above, and the memory unit 1010 may include the semiconductor devices 100, 200, 300, 301, 400, and 500, a capacitor, or combinations thereof. The memory unit 1010 may include a main memory and a cache memory. The electronic device architecture (chip) 1000 may be an on-chip memory processing unit.

Referring to FIG. 9, a cache memory 1510, an ALU 1520, and a control unit 1530 may form a central processing unit (CPU) 1500. The cache memory 1510 may include a static random-access memory (SRAM), and may include the semiconductor devices 100, 200, 300, 301, 400, and 500 described above. Separate from the CPU 1500, a main memory 1600 and an auxiliary storage 1700 may be provided, and an input/output devices 2500 may be provided. The main memory 1600 may include a dynamic random-access memory (DRAM) device. The CPU 1500 may control the main memory 1600 to read data from and/or write data to the memory 1600 in response to a request from an external host. The CPU 1500 may be configured to exchange data with the external host.

In some cases, the electronic device architecture may be implemented in a form in which computing unit devices and memory unit devices are adjacent to each other in one chip, without distinction of sub-units.

In the semiconductor device according to the embodiment, the conductive layer including the metal boride is provided on the contact areas of the channel layer including the 2D semiconductor material. Because the metal borides may have the work functions in various ranges according to a composition thereof, the metal boride having appropriate work function may be selected according to the 2D semiconductor material used in the channel layer, and thus, the contact resistance between the channel layer and the conductive layers may be reduced. Also, because the metal boride has various crystallization structures according to the composition thereof, when the metal boride having the crystallization structure that is similar to the 2D semiconductor material used as the channel material is selected, occurrence of defects in the 2D semiconductor material during the deposition of the metal boride may be reduced. Accordingly, the contact resistance between the 2D semiconductor material and the conductive layer may be decreased. Although the embodiments have been described above, these are merely example, and various modifications may be made therefrom by those of ordinary skill in the art.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of inventive concepts as defined by the following claims.

What is claimed is:

1. A semiconductor device comprising:

a channel layer including a two-dimensional (2D) semiconductor material;

a gate insulating layer on an upper surface of the channel layer;

a gate electrode on the gate insulating layer; and a first conductive layer and a second conductive layer respectively on opposite sides of the channel layer, wherein each of the first conductive layer and the second conductive layer include metal boride, the first conductive layer and the second conductive layer do not contact a bottom surface of the channel layer, and the bottom surface of the channel layer is opposite the upper surface of the channel layer.

2. The semiconductor device of claim 1, wherein the metal boride includes a compound of a transition metal and boron (B).

3. The semiconductor device of claim 2, wherein the metal boride includes at least one of $YB_4$, $LaB_6$, $MnB_2$, $NbB_2$, $TaB_2$, $ScB_2$, $CrB_2$, $TiB_2$, $ZrB_2$, and $HfB_2$.

4. The semiconductor device of claim 2, wherein the metal boride includes a material having semimetal characteristics.

5. The semiconductor device of claim 4, wherein the metal boride includes at least one of $TiB_2$, $ZrB_2$, and $HfB_2$.

6. The semiconductor device of claim 2, wherein the metal boride includes a material having a two-dimensional crystallization structure.

7. The semiconductor device of claim 6, wherein the metal boride includes a diboride including at least one of Sc, Y, Ti, Zr, Hf, V, Nb, Ta, Cr, Mo, W, Mn, Tc, Re, Ru, and Os.

8. The semiconductor device of claim 1, wherein the first conductive layer and the second conductive layer respectively include a source electrode and a drain electrode.

9. The semiconductor device of claim 1, further comprising:

a source contact and a drain contact respectively on the first conductive layer and the second conductive layer.

10. The semiconductor device of claim 9, wherein the source contact and the drain contact include a metal material.

11. The semiconductor device of claim 1, wherein the first conductive layer and the second conductive layer are on the upper surface of the channel layer at opposite sides of the channel layer, and the first conductive layer and the second conductive layer form planar contacts with the channel layer.

12. The semiconductor device of claim 1, wherein the first conductive layer and the second conductive layer are on side surfaces of opposite sides of the channel layer, and the first conductive layer and the second conductive layer form edge contacts with the channel layer.

13. The semiconductor device of claim 1, wherein the first conductive layer and the second conductive layer are spaced apart from each other on the upper surface of the channel layer, and the first conductive layer and the second conductive layer are on side surfaces of opposite sides of the channel layer.

14. The semiconductor device of claim 1, wherein intermediate regions are on interfaces between the first conductive layer and the channel layer and between the second conductive layer and the channel layer, and the intermediate regions have the 2D semiconductor material and the metal boride mixed with each other.

15. The semiconductor device of claim 1, wherein the 2D semiconductor material includes a material having a bandgap of about 0.1 eV to about 3.0 eV.

16. The semiconductor device of claim 1, wherein the 2D semiconductor material includes transition metal dichalcogenide (TMD), black phosphorous, or graphene.

17. The semiconductor device of claim 1, wherein the 2D semiconductor material further includes a dopant.

18. The semiconductor device of claim 1, wherein the 2D semiconductor material includes one to ten layers.

19. The semiconductor device of claim 1, wherein the gate electrode includes metal, conductive nitride, or conductive oxide.

20. An electronic apparatus comprising:

the semiconductor device of claim 1.

* * * * *